(12) United States Patent
Groetsch et al.

(10) Patent No.: US 9,551,479 B2
(45) Date of Patent: Jan. 24, 2017

(54) METHOD FOR PRODUCING AN ILLUMINANT

(71) Applicant: OSRAM Opto Semiconductors GmbH, Regensburg (DE)

(72) Inventors: Stefan Groetsch, Bad Abbach (DE); Frank Singer, Regenstauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/418,924

(22) PCT Filed: Jul. 3, 2013

(86) PCT No.: PCT/EP2013/064060
§ 371 (c)(1),
(2) Date: Jan. 30, 2015

(87) PCT Pub. No.: WO2014/019795
PCT Pub. Date: Feb. 6, 2014

(65) Prior Publication Data
US 2015/0167938 A1   Jun. 18, 2015

(30) Foreign Application Priority Data
Jul. 31, 2012  (DE) .................. 10 2012 106 982

(51) Int. Cl.
*H01L 21/00*  (2006.01)
*H01L 33/00*  (2010.01)
(Continued)

(52) U.S. Cl.
CPC ........ *F21V 19/0015* (2013.01); *F21S 48/1104* (2013.01); *F21S 48/1159* (2013.01);
(Continued)

(58) Field of Classification Search
CPC ...... H01L 33/48; H01L 33/483; H01L 33/486; F21V 19/0015; F21V 19/002; F21V 19/0025; F21V 19/003; F21V 19/0035; F21V 19/005; F21V 19/0055; F21S 48/1104; F21S 48/211
(Continued)

(56) References Cited

U.S. PATENT DOCUMENTS 5,567,036 A   10/1996   Theobald et al.
5,947,588 A   9/1999   Huang
(Continued)

FOREIGN PATENT DOCUMENTS

DE   102006015115 A1   10/2007
DE   102007050893 A1   4/2009
(Continued)

*Primary Examiner* — Fernando L Toledo
*Assistant Examiner* — Aaron Gray
(74) *Attorney, Agent, or Firm* — McDermott Will & Emery LLP

(57) ABSTRACT

A method for producing an illuminant is specified, in which a positioning device (3) holds an optoelectronic semiconductor component (1) inside a tolerance range (4) on the upper side of a connection carrier (2) during the mechanical fixation and electrical connecting of the optoelectronic semiconductor component (1) to the connection carrier (2).

15 Claims, 11 Drawing Sheets

Figure 1A:
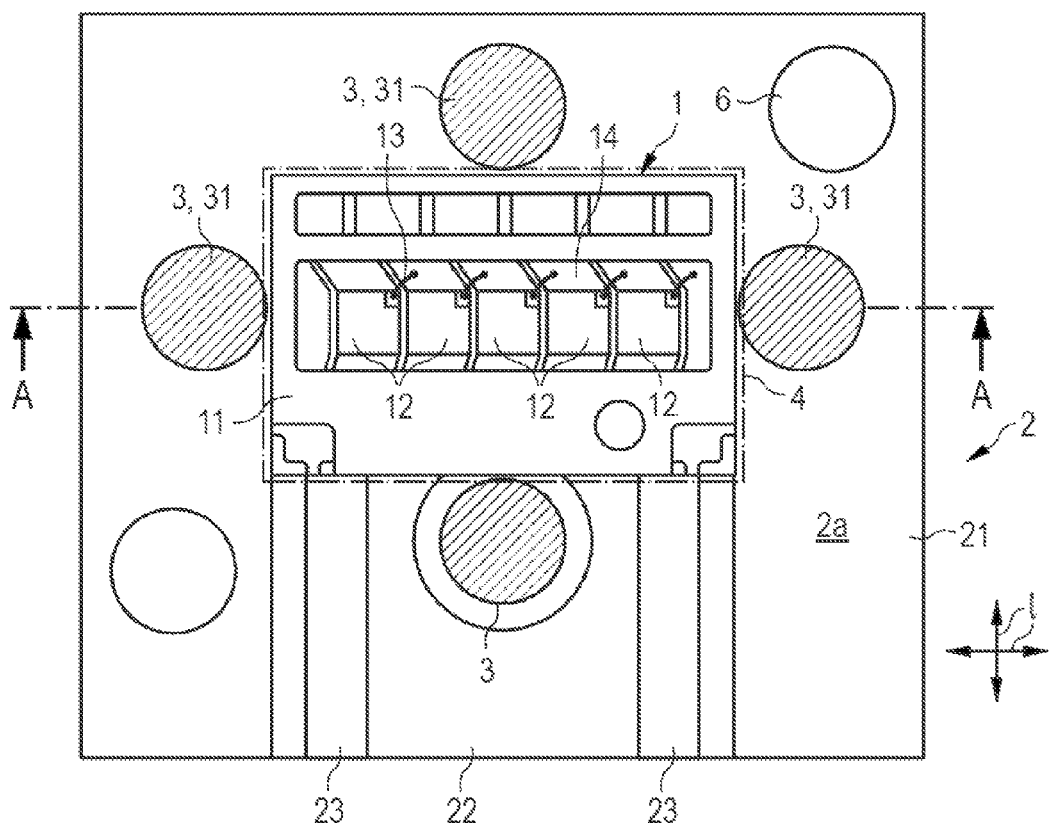
Figure 1A:
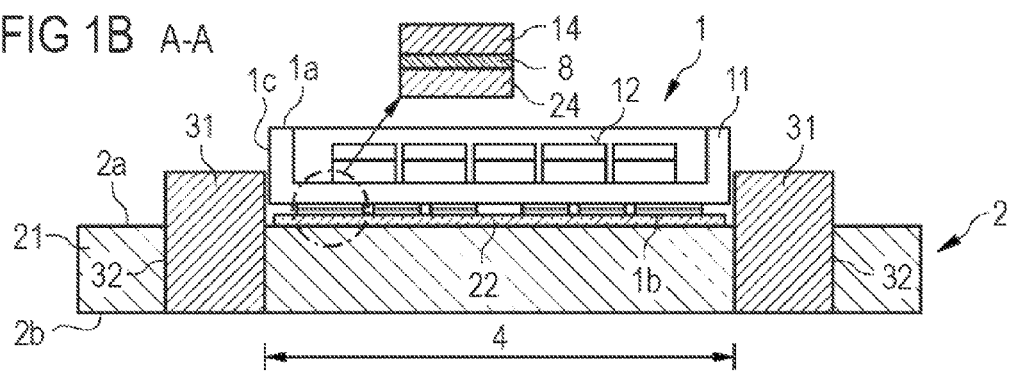

(51) Int. Cl.
*H01L 23/495* (2006.01)
*H01L 23/48* (2006.01)
*H01L 23/52* (2006.01)
*H01L 29/40* (2006.01)
*F21V 19/00* (2006.01)
*H01L 33/48* (2010.01)
*F21S 8/10* (2006.01)
*F21V 29/70* (2015.01)
*H01L 25/075* (2006.01)

(52) U.S. Cl.
CPC ............ *F21S 48/211* (2013.01); *F21S 48/215* (2013.01); *F21V 29/70* (2015.01); *H01L 33/486* (2013.01); *F21S 48/328* (2013.01); *H01L 25/0753* (2013.01); *H01L 2224/48* (2013.01); *H01L 2924/0002* (2013.01); *Y10T 29/41* (2015.01)

(58) Field of Classification Search
USPC ....... 438/26; 257/99, 778, 676, 797, E33.057
See application file for complete search history.

(56) References Cited

U.S. PATENT DOCUMENTS

| | | |
|---|---|---|
| 6,149,288 A | 11/2000 | Huang |
| 6,741,778 B1* | 5/2004 | Chan .................... G02B 6/4231 385/52 |
| 7,397,982 B2 | 7/2008 | Sailer et al. |
| 2003/0196831 A1* | 10/2003 | Momokawa ......... H05K 3/3447 174/251 |
| 2006/0131596 A1 | 6/2006 | Ouderkirk et al. |
| 2007/0007540 A1 | 1/2007 | Hashimoto et al. |
| 2008/0135869 A1* | 6/2008 | Liu ....................... H01L 33/483 257/99 |
| 2009/0001490 A1 | 1/2009 | Bogner et al. |
| 2010/0032189 A1* | 2/2010 | Muto .................... H05K 3/301 174/252 |
| 2010/0046224 A1 | 2/2010 | Lin |
| 2010/0171135 A1 | 7/2010 | Engl et al. |
| 2010/0328961 A1 | 12/2010 | Kwon et al. |
| 2011/0062471 A1 | 3/2011 | Bierhuizen et al. |
| 2012/0080713 A1 | 4/2012 | Agatani et al. |

FOREIGN PATENT DOCUMENTS

| | | |
|---|---|---|
| DE | 102007057240 A1 | 6/2009 |
| EP | 2302283 A2 | 3/2011 |
| JP | 2005012155 A | 1/2005 |
| JP | 2008524826 A | 7/2008 |
| JP | 2011003798 A | 1/2011 |
| JP | 2012022789 A | 2/2012 |
| WO | WO-2014019795 A1 | 2/2014 |

* cited by examiner

FIG 1B A-A

METHOD FOR PRODUCING AN ILLUMINANT

A method for producing a light-emitting means is specified.

One object to be achieved consists in specifying a method for producing a light-emitting means in which a light-emitting area of the light-emitting means can be positioned particularly precisely in the light-emitting means.

The light-emitting means is, for example, a light-emitting means which is suitable for use in an automobile headlamp or an optical projection device, i.e. the light-emitting means is particularly well suited to use in conjunction with optical imaging systems such as are used in the mentioned component parts.

In accordance with at least one embodiment of the method, first an optoelectronic semiconductor component part is provided in the method. The optoelectronic semiconductor component part is, for example, a light-emitting diode.

The optoelectronic semiconductor component part in this case comprises at least one light-emitting diode chip, in particular a multiplicity of light-emitting diode chips. For example, the optoelectronic semiconductor component part comprises at least two light-emitting diode chips, which are connected electrically in series or parallel with one another in the optoelectronic component part. The light-emitting diode chips are, for example, light-emitting diode chips as are described in the publication US 2010/0171135. The disclosure of said publication is hereby incorporated expressly by reference.

For example, the light-emitting diode chips each have a light-emitting front side, which is free from electrical contact points such as bond pads. The risk of shadowing and/or absorption of some of the electromagnetic radiation emitted during operation by an active zone of the light-emitting diode chips by the electrical contact points is reduced in this way. It is possible, for example, in an advantageous manner to dispense with complex method steps in connection with the production of such a contact point, for example polishing of the front-side surface of the light-emitting diode chips and/or the production of metal webs for current spreading which have a large thickness but a small lateral extent, and/or measures which restrict or prevent the injection of current into regions of the light-emitting diode chips beneath the electrical contact point, for example the formation of an electrically insulating layer, a Schottky barrier and/or an ion-implanted region beneath the contact point. The sum of the light-emitting front sides of all of the light-emitting diode chips forms the light-emitting area of the light-emitting means.

The optoelectronic semiconductor component part preferably comprises a housing body, on or in which the at least one light-emitting diode chip is arranged. For example, the housing body can be in the form of a planar plate, with the at least one light-emitting diode chip being arranged on the upper side thereof. In addition, it is possible for the housing body to have at least one cavity, in which the at least one light-emitting diode chip is arranged.

The optoelectronic semiconductor component part further comprises at least two electrical connection points, which are arranged on a lower side of the optoelectronic semiconductor component part. The electrical connection points are in this case electrically conductively connected to the at least one light-emitting diode chip. The light-emitting diode chips of the optoelectronic component part can be operated by virtue of contact being made with the electrical connection points.

For example, the housing body of the optoelectronic semiconductor component part is a so-called QFN housing body (quad-flat no-leads package). In this case, the electrical connection points of the optoelectronic semiconductor component part are arranged exclusively on the lower side of the optoelectronic semiconductor component part and therefore, for example, on the lower side of the housing body, and at no point do the electrical connection points protrude beyond the housing body in the lateral direction. The lateral directions are those directions which lie in a plane which runs, for example, parallel to the main plane of extent of the lower side of the housing body.

In accordance with at least one embodiment of the method, the method comprises a method step in which a connection carrier is provided. The connection carrier is, for example, a printed circuit board. The connection carrier comprises, for example, a basic body, on or in which electrical conductor tracks and/or contact points are structured. The connection carrier comprises, for example, at least two contact points, to which electric current can be applied. The contact points are arranged on an upper side of the connection carrier. For example, the connection carrier is a metal-core printed circuit board.

In accordance with at least one embodiment of the method for producing a light-emitting means, the method comprises a step in which a positioning apparatus is provided which is in direct contact with the connection carrier and/or the optoelectronic semiconductor component part. The positioning apparatus is suitable and intended for keeping the optoelectronic semiconductor component part in a specific position relative to the connection carrier during mechanical fastening and electrical connection to the connection carrier. In this case, the positioning apparatus does not need to enable precise adjustment of the optoelectronic semiconductor component part relative to the connection carrier, but it may be sufficient for the positioning apparatus to preset the relative position of the connection carrier and the optoelectronic semiconductor component part within a specific tolerance range.

In accordance with at least one embodiment of a method for producing a light-emitting means, the method comprises a method step in which a connecting means is provided between the connection points of the optoelectronic semiconductor component part and the contact points of the connection carrier. The connecting means may be, for example, an electrically conductive adhesive or a solder material. The optoelectronic semiconductor component part is fastened mechanically fixedly and electrically conductively on the connection carrier by means of the connecting means. For example, the connecting means is only located between mutually opposite connection points of the optoelectronic semiconductor component part and contact points of the connection carrier.

In accordance with at least one embodiment of the method for producing a light-emitting means, the method comprises a method step in which mechanical fastening and electrical connection of the optoelectronic semiconductor component part on the connection carrier is performed by means of the connecting means. This can take place, for example, by curing and/or solidification of the connecting means.

In accordance with at least one embodiment of the method for producing a light-emitting means, the positioning apparatus keeps the optoelectronic semiconductor component part within a tolerance range on the upper side of the connection carrier during the mechanical fastening and electrical connection. That is to say that, there is a range, the tolerance range, within which the optoelectronic semiconductor component part is intended to be fastened on the connection carrier on the upper side, facing the optoelectronic semiconductor component part, of the connection carrier. The tolerance range may be a preset, in particular virtual range, i.e. a range which is not physically identified on the connection carrier, within which the optoelectronic semiconductor component part is intended to be located on the connection carrier after fastening.

In other words, the positioning apparatus keeps the optoelectronic semiconductor component part within the tolerance range with a certain amount of play during the fastening and connecting operation. The tolerance in any desired direction in the plane in which the tolerance range lies is at most 10%, in particular at most 5% or at most 3%, preferably at most 1% of the extent of the optoelectronic semiconductor component part in this direction, for example. The tolerance is in this case, for example, at most +/−75 µm, in particular at most +/−50 µm.

In accordance with at least one embodiment of the method for producing a light-emitting means, the method comprises the following steps:

providing an optoelectronic semiconductor component part comprising a housing body, at least one light-emitting diode chip, which is arranged in the housing body, and at least two electrical connection points, which are arranged on a lower side of the optoelectronic semiconductor component part, providing a connection carrier comprising at least two contact points, which are arranged on an upper side of the connection carrier, providing a positioning apparatus, which is in direct contact with the connection carrier and/or the optoelectronic semiconductor component part, providing a connecting means between the connection points of the optoelectronic semiconductor component part and the contact points of the connection carrier, mechanically fastening and electrically connecting the optoelectronic semiconductor component part on the connection carrier by means of the connecting means, wherein the positioning apparatus keeps the optoelectronic semiconductor component part within a tolerance range on the upper side of the connection carrier during the mechanical fastening and electrical connection.

By means of the method described here, it is possible to adjust the optoelectronic semiconductor component part particularly precisely with respect to the connection carrier and therefore also with respect to further components, for example optical components, of the light-emitting means. When using the light-emitting means in imaging systems, for example an automobile headlamp or an optical projection device, the light-emitting means needs to be mounted with high precision with respect to the optical systems arranged downstream of the light-emitting means. During fastening of an optoelectronic semiconductor component part on a connection carrier, for example by means of soldering or adhesive bonding, however, "floating" of the optoelectronic semiconductor component part with respect to the connection points of the connection carrier results. In addition, the connection points generally themselves already have a relatively high degree of inaccuracy with respect to their positioning relative to their reference structures, such as, for example, locating holes, which in turn are used for the mechanical adjustment and/or fastening of further components, for example an optical element. The chain of tolerances for the positioning of the light-emitting area of the light-emitting means, i.e. the light-emitting front sides of the light-emitting diode chips, with respect to optical elements is therefore very long.

Owing to the method described here, in particular owing to the use of the positioning apparatus, more precise fastening of the optoelectronic semiconductor component part relative to the connection carrier and therefore also relative to downstream systems is performed than was previously possible. The "floating" of the optoelectronic component part is restricted to a relatively small tolerance range by the positioning apparatus. In this case, however, there is no rigid adjustment prior to the mechanical fastening and electrical connection by the connecting means, as a result of which strain relief is provided in the case of cyclic stress, i.e. heating and cooling of the light-emitting means. In addition, the mechanical shear stress of the connection between the optoelectronic semiconductor component part and the connection carrier is reduced. The connections between the optoelectronic semiconductor component part and the connection carrier are thus protected during operation of the light-emitting means.

In accordance with at least one embodiment of the method, the tolerance range is completely in a plane which runs parallel to the main plane of extent of the lower side, facing the connection carrier, of the optoelectronic semiconductor component part. In other words, the tolerance range relates to the lateral directions which run, for example, at least at points, parallel to the lower side, facing the connection carrier, of the semiconductor component part. In the vertical direction, for example perpendicular to the main plane of extent of the lower side, facing the connection carrier, of the optoelectronic semiconductor component part, no tolerance range is then preset by the positioning apparatus during the mechanical fastening and electrical connection, for example.

In accordance with at least one embodiment of the method, the tolerance range has an area which is greater than the maximum cross-sectional area of the optoelectronic semiconductor component part on the lower side, facing the connection carrier, of the optoelectronic semiconductor component part in a plane parallel to the plane in which the tolerance range lies. In other words, the tolerance range in respect of its area is greater than the connection area of the optoelectronic semiconductor component part. For example, the tolerance range is at most 10%, in particular at most 5%, preferably at most 1% greater than the connection area of the optoelectronic semiconductor component part. In this case, the tolerance is, for example, at most +/−100 µm, in particular at most +/−50 µm, in particular at most +/−30 µm.

In accordance with at least one embodiment of the method, the positioning apparatus comprises at least two components, which are formed and/or fastened on the connection carrier and/or on the optoelectronic semiconductor component part. The components may be, for example, pins, i.e. three-dimensional bodies with a main direction of extent, for example rod-shaped protrusions which have, for example, a circular, square, rectangular, oval or other cross section. In addition, it is possible for the components to be cutouts such as, for example, holes or bores in the connection carrier and/or in the optoelectronic semiconductor component part. The components of the positioning apparatus can be formed in one piece with the connection carrier and/or the optoelectronic semiconductor component part and can be produced already during production of the connection carrier and/or the optoelectronic semiconductor component part, for example. In addition, it is possible for the components of the positioning apparatus to be fastened on the connection carrier and/or on the optoelectronic semiconductor component part. In this case, it is in particular also possible for the components of the positioning apparatus to be capable of being detached at least partially from the connection carrier and/or optoelectronic semiconductor component part once a mechanical and electrically conductive connection has been produced between the connection carrier and the optoelectronic semiconductor chip.

In accordance with at least one embodiment of the invention, the positioning apparatus comprises at least three pins, which are in direct contact with the connection carrier and are mechanically stable connected to the connection carrier. The pins can be plugged into corresponding cutouts in the connection carrier, for example, and mechanically connected to the connection carrier by means of a press fit. In addition, it is possible for the pins to be an integral part of the connection carrier and for them to be produced jointly with the connection carrier, for example. The pins protrude beyond the connection carrier on its upper side facing the optoelectronic semiconductor component part. This means that the pins protrude out of the connection carrier in the direction of the optoelectronic semiconductor component part on the upper side of the connection carrier. In this case, the pins delimit the tolerance range in lateral directions.

If the positioning apparatus comprises four pins, for example, a rectangular tolerance range can be delimited in lateral directions by the pins.

In order to mechanically fasten and electrically connect the optoelectronic semiconductor component part to the connection carrier, the optoelectronic semiconductor component part is introduced into the region between the pins, i.e. the tolerance range. After the mechanical fastening and electrical connection, the optoelectronic semiconductor component part is in direct contact with at most two of the pins. That is to say that the optoelectronic semiconductor component part can "float" on the connecting means, for example, during the connection in such a way that it abuts pins of the positioning apparatus. The spacing between the pins of the positioning apparatus is selected to be of such a size that the optoelectronic semiconductor component part cannot be in contact with all of the pins and in particular cannot be in contact with more than two pins at the same time, however.

In other words, the optoelectronic semiconductor component part is not held fixedly at a certain point and clamped in there by the positioning apparatus, but can be fastened with a certain degree of tolerance. The pins on the connection carrier only prevent excessive floating of the optoelectronic semiconductor component part.

In accordance with at least one embodiment of the method, the positioning apparatus comprises at least two pins and at least two cutouts. In this case, one cutout is uniquely assigned to each pin. That is to say that, for each pin in a component of the light-emitting means, for example in the connection carrier, there is a corresponding cutout in the other component, for example in the optoelectronic semiconductor component part, in which cutout the pin can engage.

Thus, for example, one of the pins is in direct contact with the optoelectronic semiconductor component part and is mechanically stable connected to the optoelectronic semiconductor component part, and the assigned cutout is arranged in the connection carrier, or one of the pins is in direct contact with the connection carrier and is mechanically stable connected to the connection carrier, and the associated cutout is arranged in the optoelectronic semiconductor component part.

At least one pair comprising pin and assigned cutout is designed in such a way that the cutout has, at least at points, a greater diameter than the pin. In other words, the pin does not engage in the cutout with a precise fit, but rather the pin has a certain degree of play in the cutout. The play of the pin in the cutout then presets the tolerance range within which the positioning apparatus keeps the optoelectronic semiconductor component part on the upper side of the connection carrier during the mechanical fastening and electrical connection.

In accordance with at least one embodiment of the method, the positioning apparatus comprises a frame, which protrudes beyond the connection carrier on its upper side facing the optoelectronic semiconductor component part, wherein the frame delimits the tolerance range in lateral directions. In addition to this, the frame comprises in particular a spring element, via which the semiconductor component part is kept within a tolerance range on the upper side of the connection carrier during the mechanical fastening and electrical connection. On its inner faces the side faces of the semiconductor component part, for example, the frame comprises the spring element, via which the tolerance range is determined. The spring element in the process pushes the semiconductor component part into a defined position and eliminates the tolerance of the opening in the frame with respect to the semiconductor component part. The spring element can be formed, for example, using an elastic material such as a rubber or can at least comprise a metal spring. The spring element can also be an integral part of the frame.

For example, the frame is mechanically fastened fixedly on the connection carrier or integrated in the connection carrier. Within the frame, the optoelectronic semiconductor component part is arranged and is held during the mechanical and electrical connection. In other words, the frame is a type of soldering template which can be plugged onto the connection carrier, for example. The optoelectronic semiconductor component parts are inserted into the frame and fastened with a precise position. The frame can be removed again after the mechanical and electrical connection and in particular reused for producing a further, identical light-emitting means.

In accordance with at least one embodiment of the method, at least one component of the positioning apparatus, for example a pin or a frame, or the entire positioning apparatus is removed once the optoelectronic semiconductor component part has been mechanically fastened and electrically connected on the connection carrier. It is possible here for only a single component of the positioning apparatus to be removed. That is to say that in particular at least part of the positioning apparatus or at least one component of the positioning apparatus is removed. In this case, it is in particular possible for the positioning apparatus or the component of the positioning apparatus to be destroyed by the removal. In addition, it is possible for the positioning apparatus or the component of the positioning apparatus to have been an integral part of the connection carrier or the optoelectronic semiconductor component part prior to the removal.

In accordance with at least one embodiment of the method, the component of the positioning apparatus is mechanically stable connected to the connection carrier or the optoelectronic semiconductor component part prior to the removal, and the connection carrier or the optoelectronic semiconductor component part has separation traces after the removal which originate from the removal of the component of the positioning apparatus. In other words, the component of the positioning apparatus is formed integrally with the optoelectronic semiconductor component part even during manufacture of the optoelectronic semiconductor component part, for example. For example, the component of the positioning apparatus and of the housing body of the optoelectronic semiconductor component part are manufactured in one and the same injection-molding process. After the removal of the component of the positioning apparatus, the optoelectronic semiconductor component part then has traces of the detachment of the component of the positioning apparatus, for example on the outer side of the housing body of said optoelectronic semiconductor component part. Owing to the fact that the component of the positioning apparatus is already connected to the connection carrier or the optoelectronic semiconductor component part during production thereof, for example, the positioning apparatus is positioned particularly precisely with respect to the components of these elements, for example the light-emitting diode chips.

In accordance with at least one embodiment of the method, owing to the removal of the at least one component of the positioning apparatus, at least one cutout in the optoelectronic semiconductor component part or in the connection carrier is exposed. The cutout is, for example, a further component of the positioning apparatus, for example the cutout assigned to a pin of the positioning apparatus. The at least one exposed cutout can be used subsequently for adjusting and/or mechanically fixing an optical element. The optical element is, for example, a reflector and/or a lens, which is arranged downstream of the light-emitting diode chips in the main direction of emission thereof.

In accordance with at least one embodiment of the method, in a further method step a heat sink is provided. The heat sink is, for example, a metal plate which is suitable for taking up the heat generated in the light-emitting diode chips during operation and dissipating it over an enlarged area. In the method, mechanical fastening of the connection carrier on its lower side, facing away from the optoelectronic semiconductor component part, on the heat sink is performed. That is to say that the light-emitting means then comprises the heat sink which has the connection carrier arranged on the upper side thereof. In turn, the optoelectronic semiconductor component part is arranged on the upper side, facing away from the connection carrier, of the connection carrier.

In accordance with at least one embodiment of the method, the mechanical fastening of the connection carrier on the heat sink is performed at least partially by means of at least one component of the positioning apparatus. For example, the heat sink can be adjusted and/or mechanically fastened relative to the connection carrier once the optoelectronic semiconductor component part has been mechanically and electrically connected on the connection carrier by means of a cutout and/or a pin of the positioning apparatus. That is to say that a pin of the positioning apparatus can be brought into direct contact with the heat sink.

In accordance with at least one embodiment of the method, the optoelectronic semiconductor component part and/or the connection carrier and/or the heat sink comprises, in addition to the components of the positioning apparatus, at least one fastening means, which is adjusted with respect to the positioning apparatus, wherein an optical element is fastened mechanically relative to the semiconductor component part and/or relative to the connection carrier and/or relative to the heat sink by means of the fastening means.

Owing to the fact that the fastening means is adjusted with respect to the positioning apparatus, a particularly precise rearrangement of an optical element, for example, can be performed after the defined mechanical fastening of the optoelectronic semiconductor component part on the connection carrier. The optoelectronic semiconductor component part is positioned particularly precisely, for example relative to the connection carrier, by the positioning apparatus within the tolerance range. In turn, cutouts adjusted very precisely with respect to the tolerance range are arranged in the connection carrier, in which cutouts pins are arranged, via which the optical element can be fastened on the connection carrier.

The method described herein will be explained in more detail below with reference to exemplary embodiments and the associated figures.

FIGS. 1A, 1B, 1C, 2A, 2B, 3A, 3B, 4A, 4B, 5A, 5B, 5C, 5D, 5E, 5F, 6A, 6B, 7A, 7B, 7C, 7D, 7E show method steps of exemplary embodiments of methods described herein using schematic illustrations.

Identical, similar or functionally identical elements have been provided with the same reference symbols in the figures. The figures and the size ratios of the elements illustrated in the figures with respect to one another should not be considered as being true to scale. Instead, individual elements can have been illustrated as disproportionately large for improved clarity and/or improved comprehensibility.

Figure 1C:
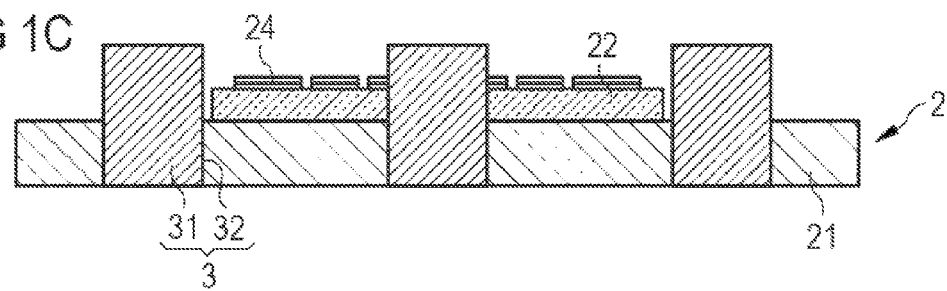

A first exemplary embodiment of a method described herein is explained in more detail in conjunction with the schematic illustrations in FIGS. 1A to 1C. In the method, an optoelectronic semiconductor component part 1 is provided. The optoelectronic semiconductor component part 1 comprises a housing body 11. The housing body 11 in this case has a cavity, in which five light-emitting diode chips 12 are arranged. The light-emitting diode chips 12 are electrically conductively connected to electrical connection points 14. The light-emitting diode chips 12 of the optoelectronic semiconductor component part 1 are connected in series via contact wires 13.

The optoelectronic semiconductor component part is arranged on the connection carrier 2. The connection carrier 2 is, for example, a metal-core printed circuit board. The connection carrier 2 has a metallic basic body 21. At points, an insulation layer 22 consisting of an electrically insulating material is applied to the metallic basic body 21. In turn, on the side facing away from the basic body 21, at least one conductor track 23 is formed on the insulation layer 22, which conductor track is electrically conductively connected to contact points 24. The optoelectronic semiconductor component part 1 is arranged with its lower side 1b, facing away from the upper side 1a, on the upper side 2a of the connection carrier 2.

In addition, a positioning apparatus 3 is provided. In this case, the positioning apparatus 3 comprises pins 31 and cutouts 32. The pins 31, in particular locating pins, are mechanically stable connected to cutouts 32, for example locating bores, in the connection carrier 2. In this case, the positioning apparatus 3 comprises four pins, which define a tolerance range 4 on the upper side 2a of the connection carrier 2. The pins 31, which are fitted with high precision at defined points on the connection carrier 2, prevent excessive floating of the optoelectronic semiconductor component part 1 during the mechanical and electrical connection of the contact points 24 to the connection points 14 via the connecting means 8, which is a solder material, for example. FIG. 1B shows in this case a sectional illustration along the line AA which passes through the optoelectronic semiconductor component part 1. FIG. 1C shows a side view of the connection carrier 2 with the positioning apparatus 3 prior to application of the optoelectronic semiconductor component part 1.

Optionally, the connection carrier 2 can have fastening means 6, in this case in the form of cutouts or adjustment reference bores, which are adjusted with high precision with respect to the positioning apparatus 3 and therefore the pins 31. For example, the tolerance in the case of the spacing of the pins 31 with respect to the fastening means 6 is at most +/−25 μm.

Figure 2A:
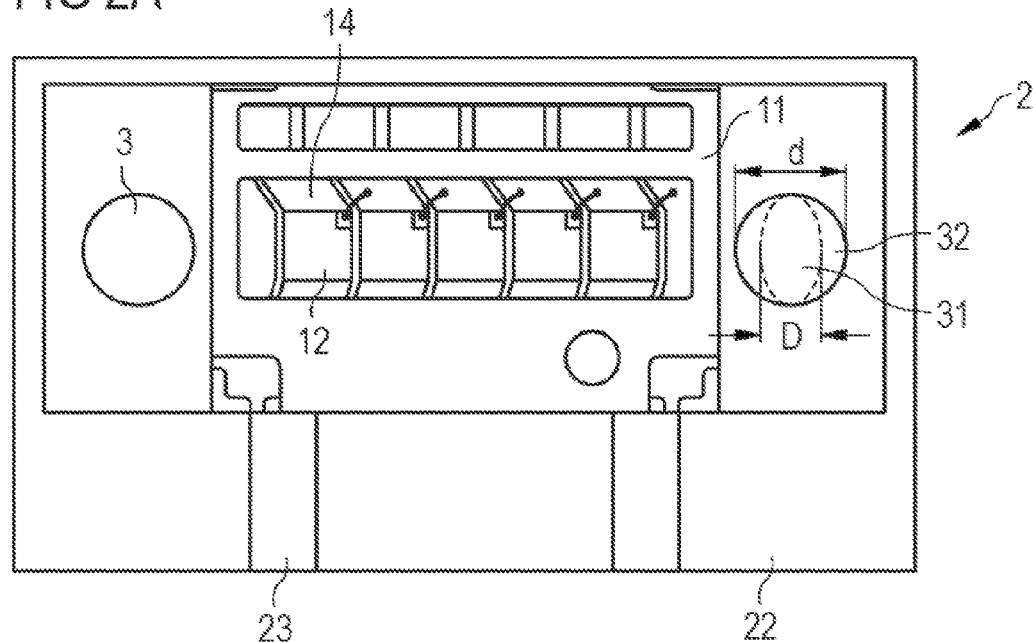
Figure 2B:
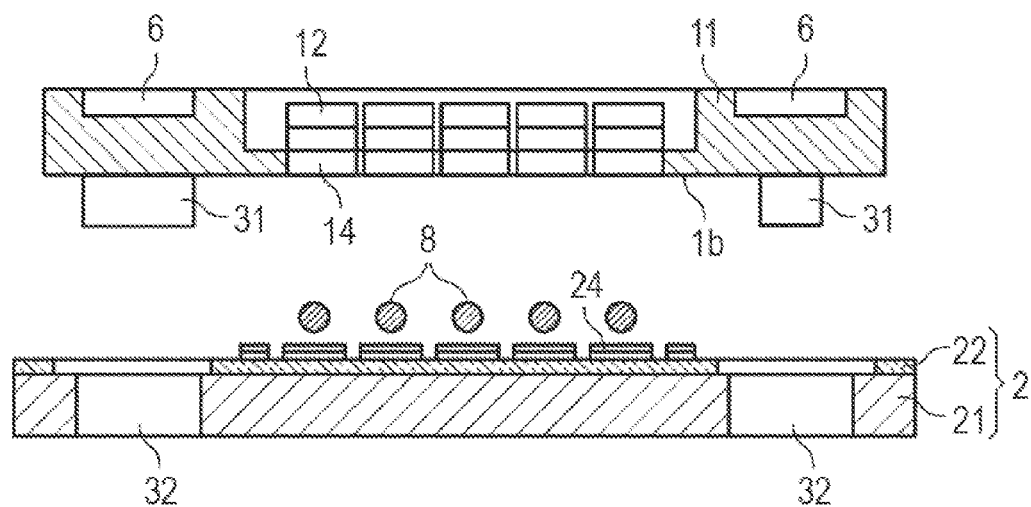

A further exemplary embodiment of a method described herein is described in conjunction with the schematic illustrations in FIGS. 2A and 2B. In this exemplary embodiment, the optoelectronic semiconductor component part has pins 31 on its lower side 1b facing the connection carrier 2, which pins represent adjustment pins. For example, the pins 31 can have insertion bevels (not illustrated), via which they can be inserted particularly easily into corresponding cutouts 32 in the connection carrier 2. The pins 31 are, for example, integral parts of the housing body 11 which can be adjusted during production of the housing body 11, for example during a molding process, with high precision with respect to the cutouts 32 in the connection carrier 2.

At least one of the pins 31 can in this case have a smaller diameter D than the diameter d of the cutout. In this way, a tolerance range 4 for the fastening of the optoelectronic semiconductor component part 1 on the connection carrier 2 is formed.

In the exemplary embodiment shown in FIGS. 2A and 2B, for example, the pin 31 illustrated in the figures is not circular on the right-hand side, but is oval, with the result that, when it is positioned in the corresponding cutout 32 in the connection carrier 2, a certain amount of play results, which ensures the tolerance range 4 during connection of the optoelectronic semiconductor component part 1 and the connection carrier 2.

Figure 5A:
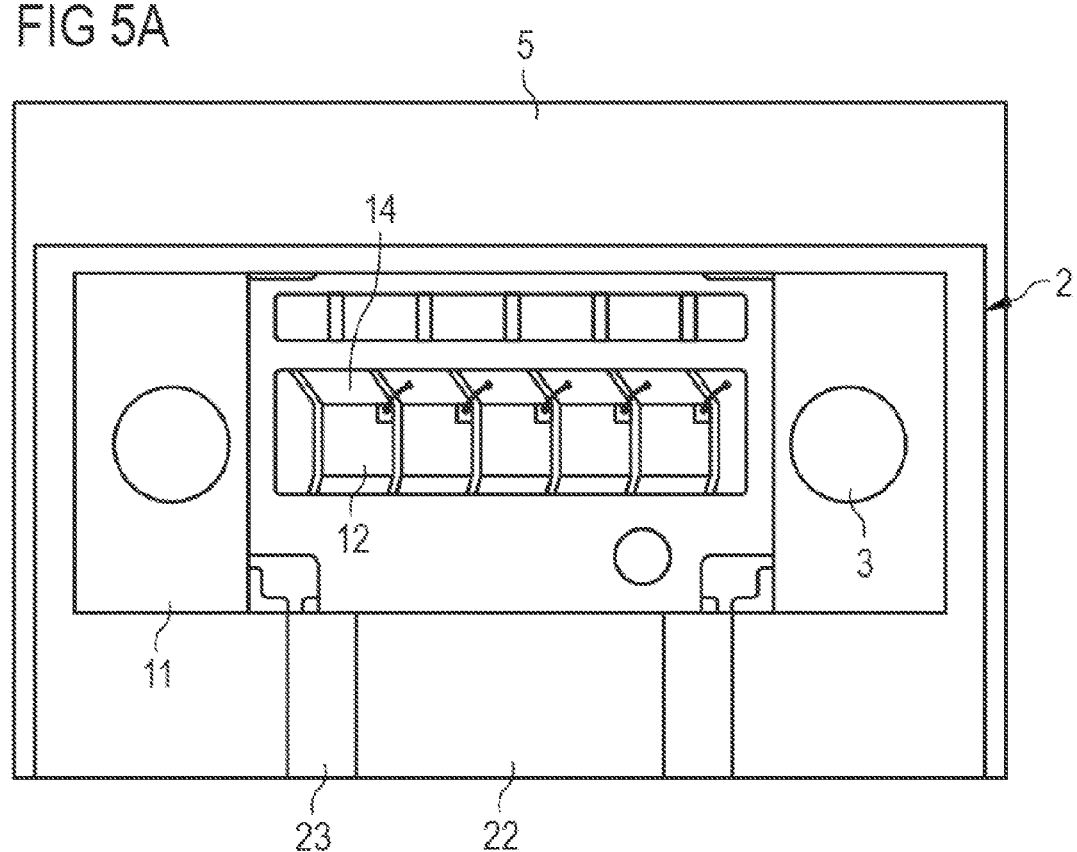
Figure 5B:
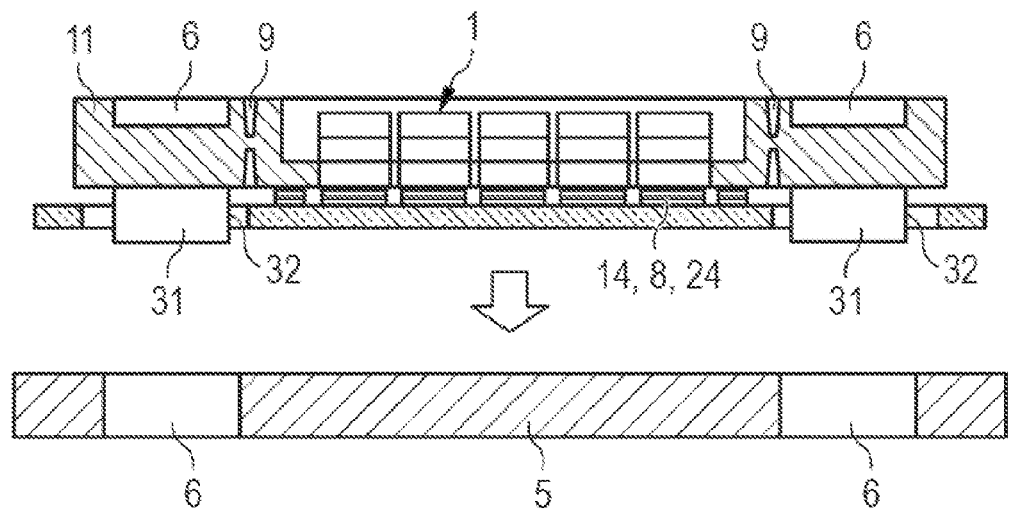
Figure 5C:
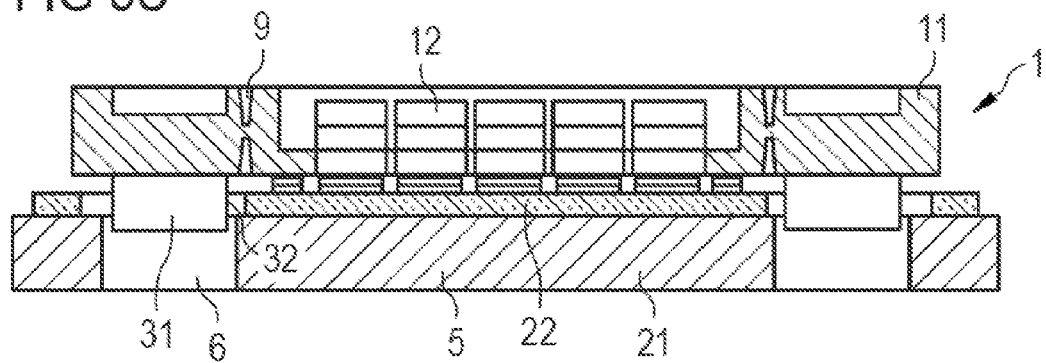
Figure 5D:
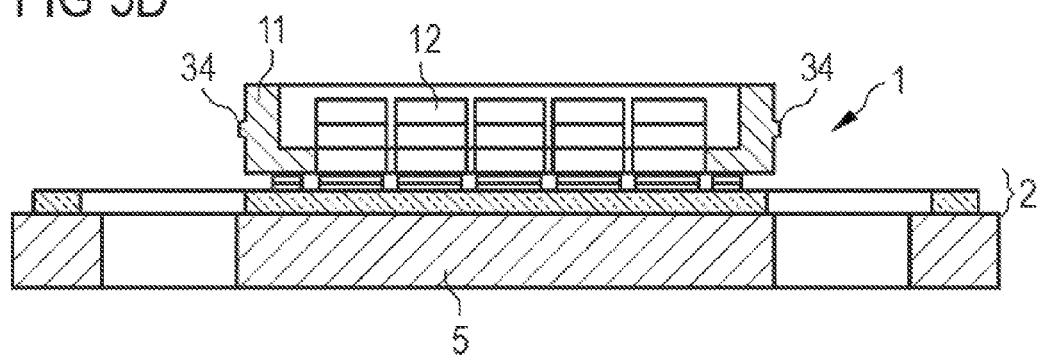
Figure 5E:
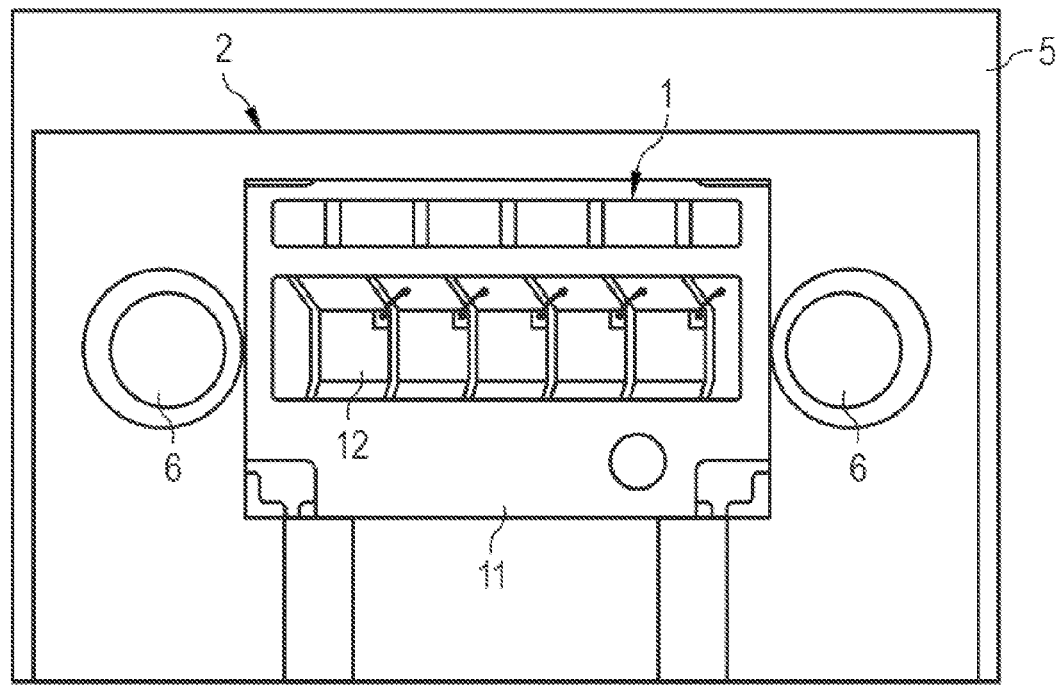
Figure 5F:
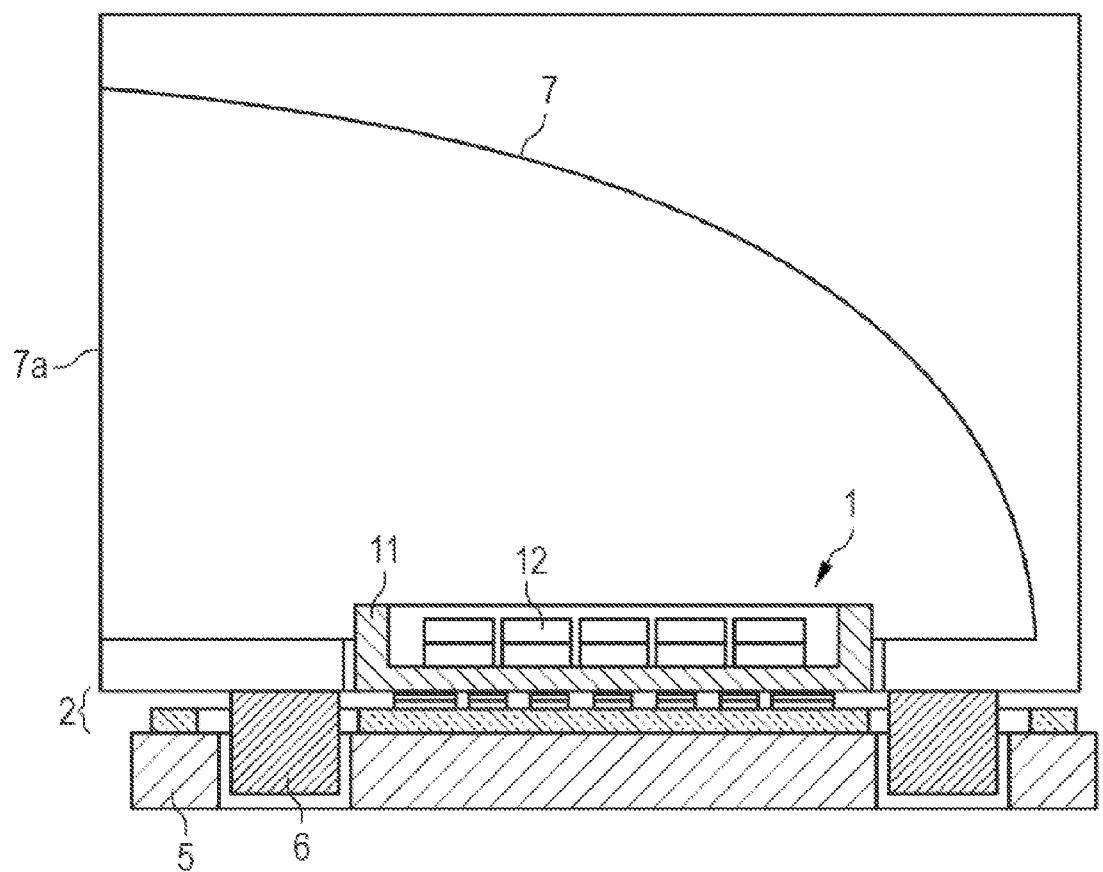

Fastening means 6, for example in the form of circular or slot-like adjustment depressions or cutouts, can be formed in the upper side of the optoelectronic semiconductor component part 1 and can receive, for example, the adjustment pins of an optical element (cf. in this regard, for example, also FIG. 5F).

Figure 3A:
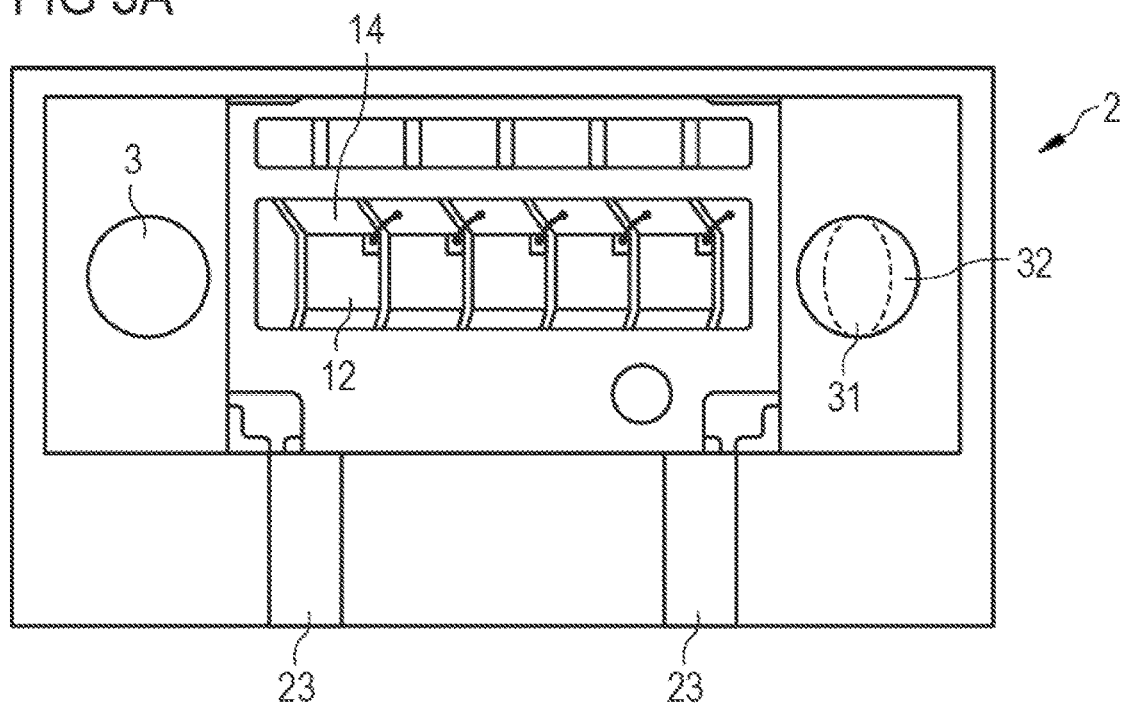
Figure 3B:
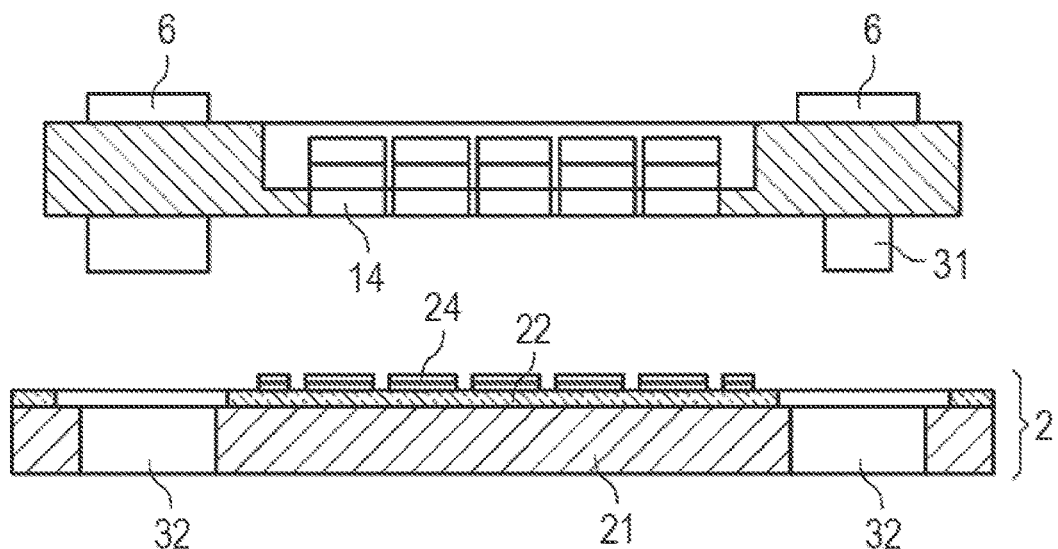

In contrast to the exemplary embodiment in FIGS. 2A and 2B, in conjunction with the exemplary embodiment shown in FIGS. 3A and 3B, an exemplary embodiment is shown in which the fastening means 6 on the upper side 1A of the optoelectronic semiconductor component part 1 is in the form of a pin and not in the form of a cutout. The pins can in this case be manufactured together with the housing body 11. The pins may be oval or cross-shaped pins which protrude out of the surface of the upper side of the optoelectronic semiconductor component part 1 and which can engage in adjustment depressions or bores in an optical element in order to perform the adjustment.

Figure 4A:
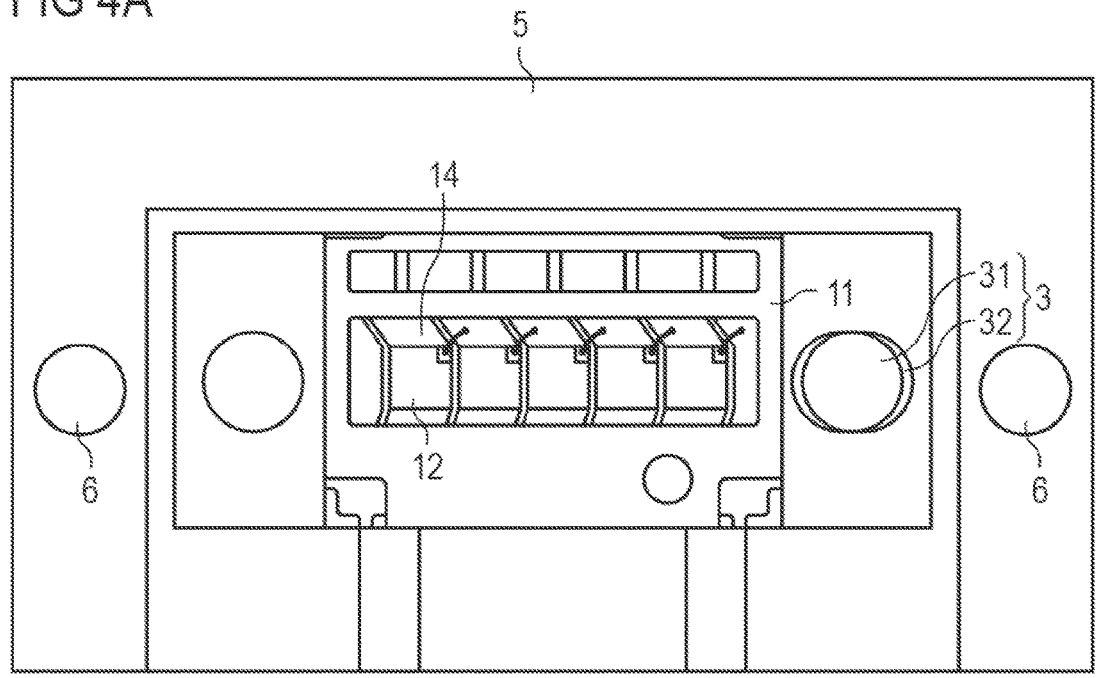
Figure 4B:
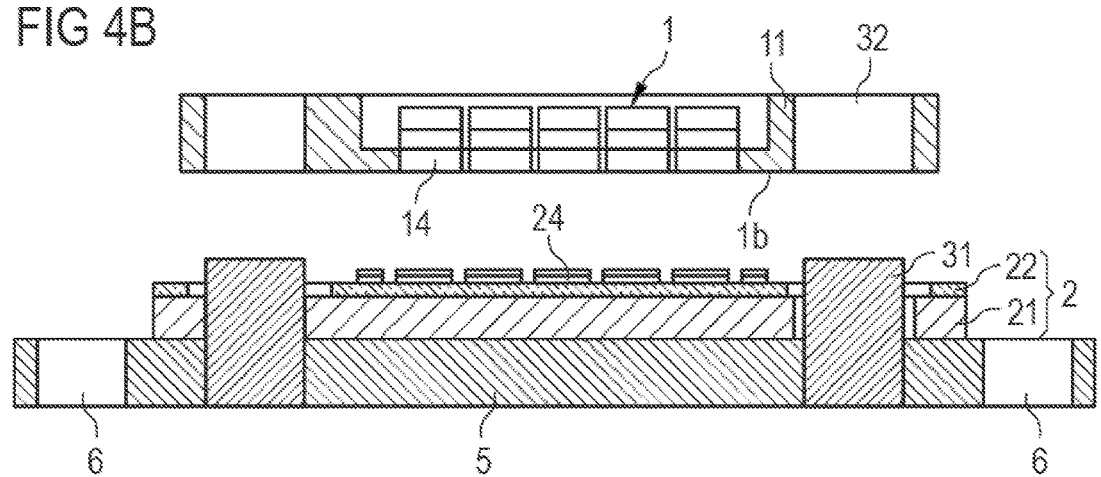

A method for producing a light-emitting means in which a heat sink 5 is arranged on the lower side 2b of the connection carrier is described in conjunction with the exemplary embodiment shown in FIGS. 4A and 4B. In this case, the pins 31 of the positioning apparatus 3 are used to position the arrangement comprising the connection carrier 2 and the optoelectronic semiconductor component part 1 with high precision on the heat sink 5. The heat sink 5 can in turn have fastening means 6, in this case in the form of cutouts, which are adjusted with respect to the cutouts into which the pin 31 of the positioning apparatus 3 is inserted. In this way, for example, an optical element can be arranged in a defined manner relative to the optoelectronic semiconductor component part 1.

The arrangement comprising the connection carrier 2 and the optoelectronic semiconductor component part 1 can in this case be produced, for example, as described in conjunction with FIGS. 1A to 1C.

A further exemplary embodiment of a method described herein for producing a light-emitting means is explained in conjunction with FIGS. 5A to 5F. In this exemplary embodiment, the positioning apparatus 3 comprises pins 31, which are an integral part of the optoelectronic semiconductor component part 1, for example the housing body 11. In this case, separation regions 9, which are in the form of constrictions in the material of the housing body 11, for example, are provided in the housing body 11. Once the optoelectronic semiconductor component part 1 and the connection carrier 2 have been connected, which takes place as described in conjunction with FIGS. 1A to 1C, for example, this arrangement can be connected to a heat sink 5 via the pins 31, wherein an adjustment of the heat sink 5 with respect to the connection carrier 2 is performed via the pins 31.

Owing to the constrictions in the region of the separation regions 9, the pins 31 as a component of the positioning apparatus 3 are subsequently detachable (cf. in this regard FIG. 5D). Owing to the detachment of the pins 31, the cutout in the heat sink 5 is exposed and can be used as fastening means 6 for subsequent fitting of an optical element 7, for example. The optical element 7 in the exemplary embodiment shown in FIG. 5F is a reflector which guides the light from the light-emitting diode chips 2 to a coupling-out area 7a.

In this exemplary embodiment of the method, owing to the removal of the pins 31 of the positioning apparatus 3, therefore, at least one cutout in the connection carrier 2 is exposed and the at least one exposed cutout is used for adjusting and/or mechanically fastening an optical element 7. Owing to the removal of the pins 31, i.e. a component of the positioning apparatus 3, the arrangement is subject to much less mechanical stress and, as a result, is particularly robust, especially in the case of thermal loading.

Figure 6A:
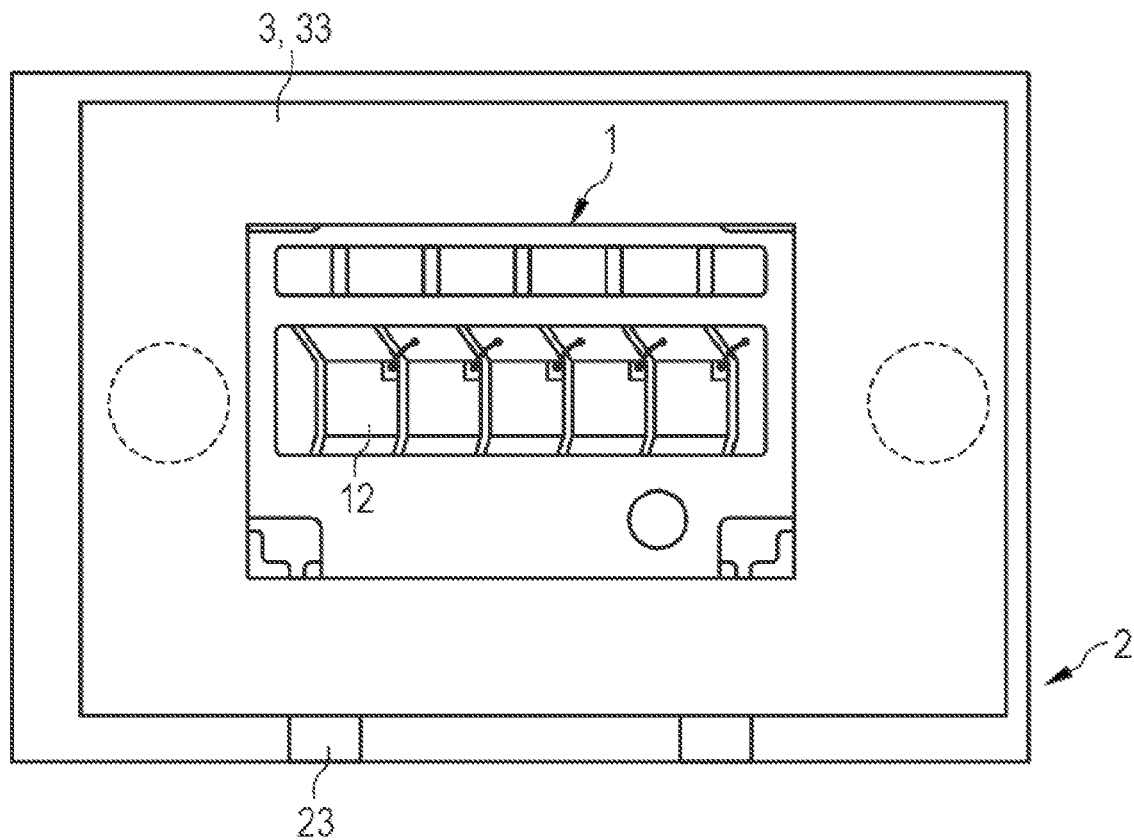
Figure 6B:
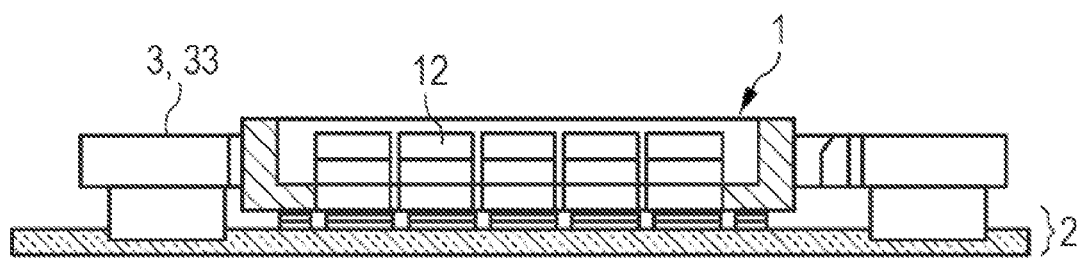
Figure 7A:
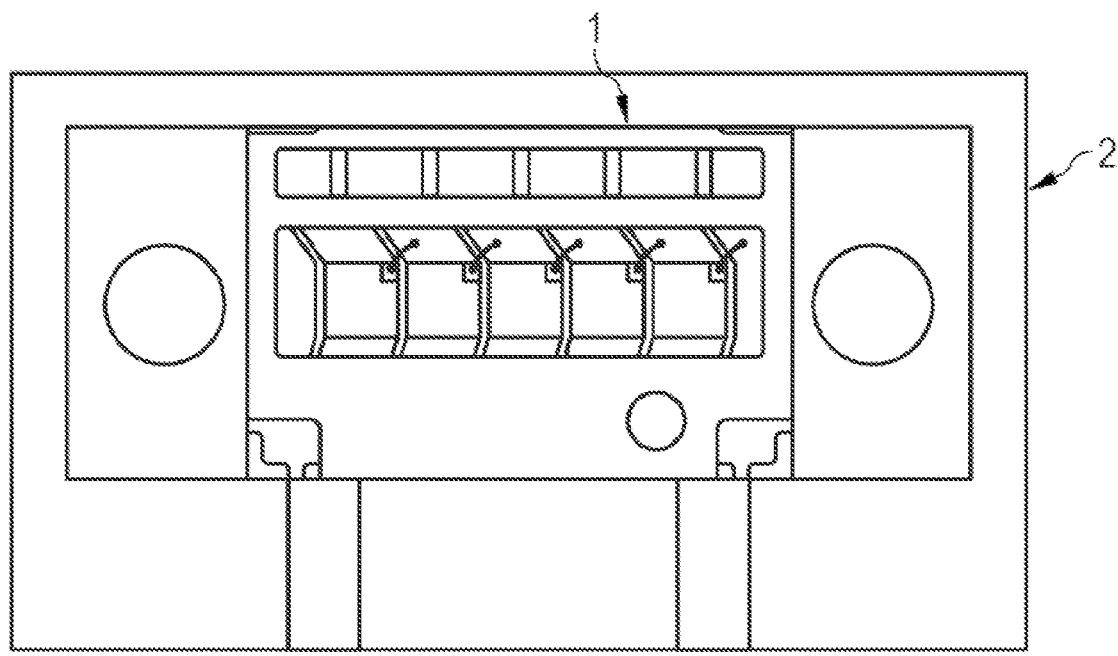
Figure 7B:
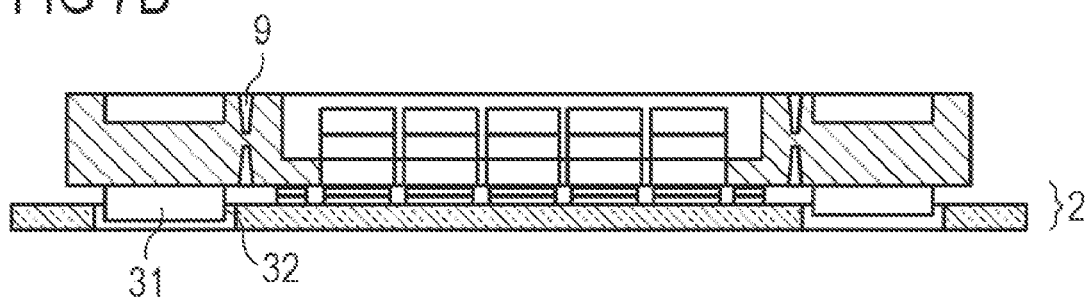
Figure 7C:
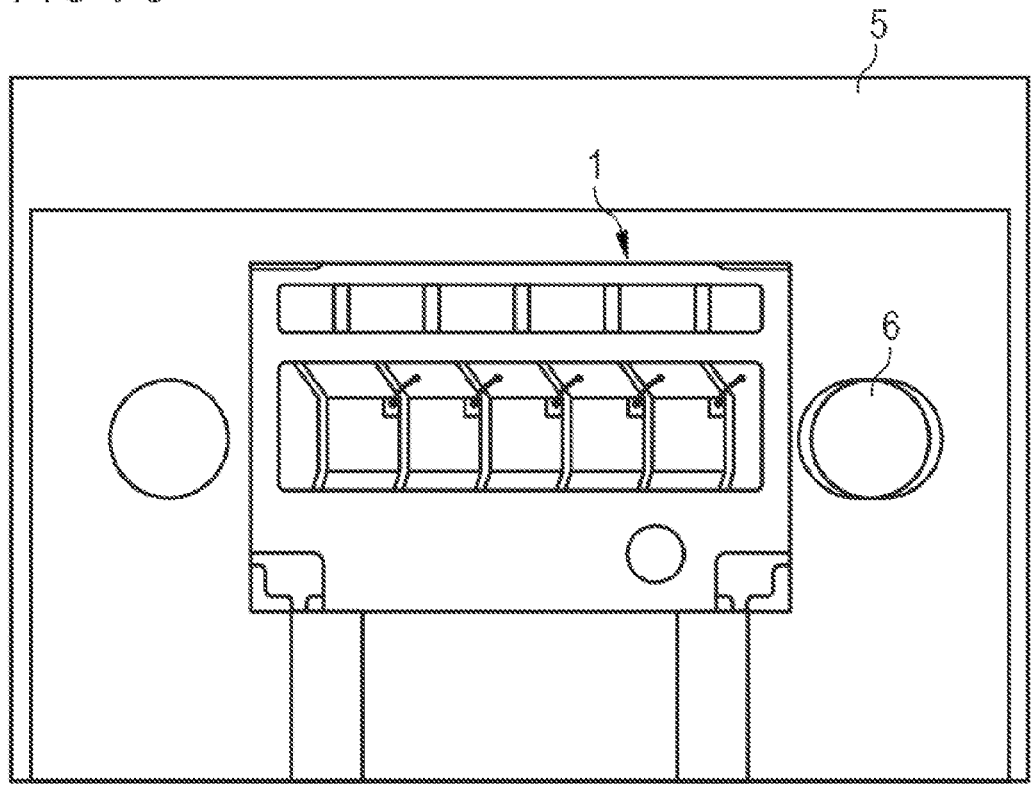
Figure 7D:
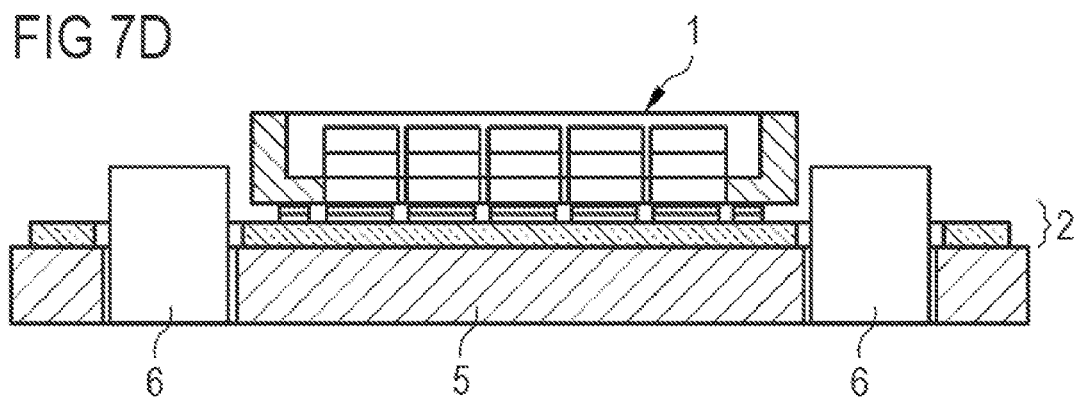
Figure 7E:
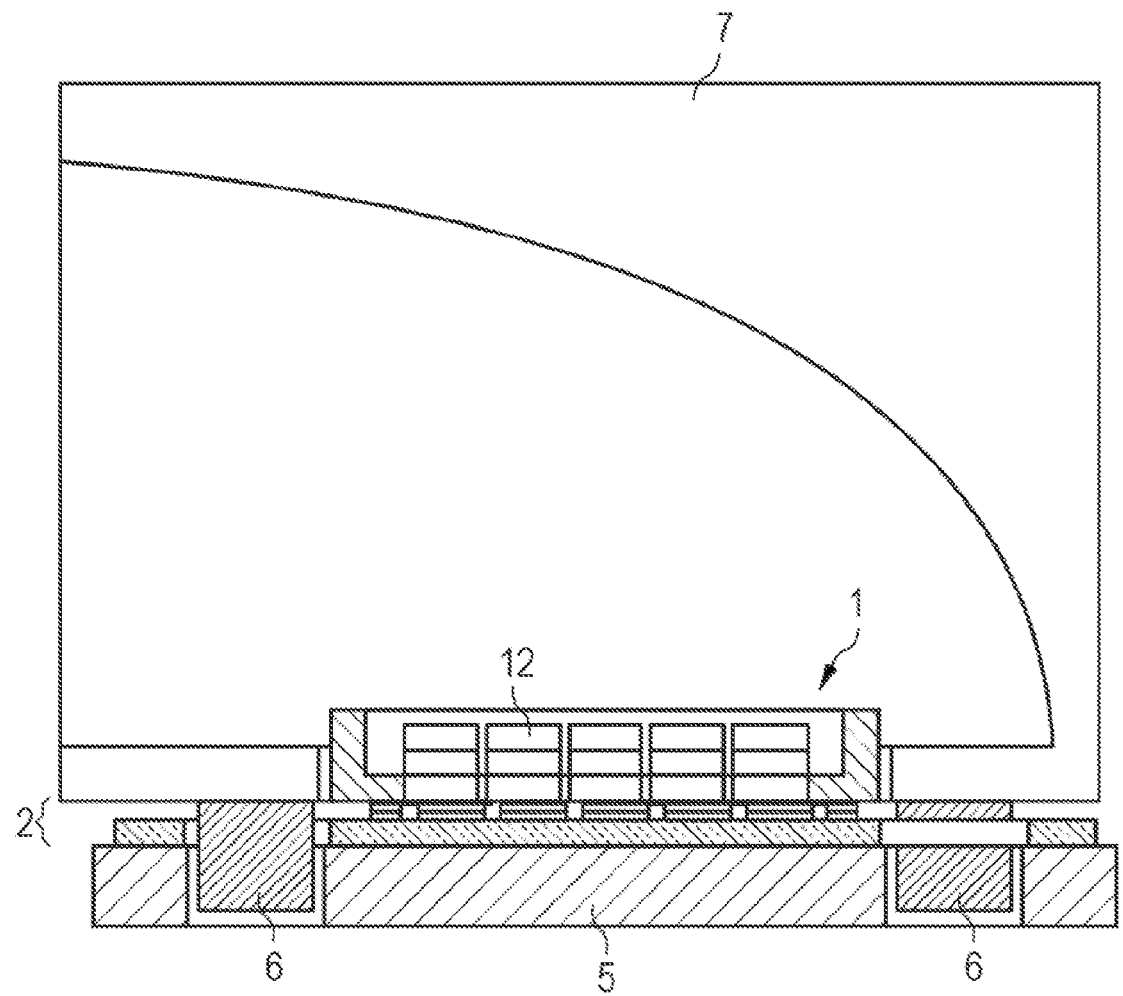

An exemplary embodiment of a method described herein in which the positioning apparatus 3 comprises a frame 33, which protrudes beyond the connection carrier on its upper side 2a, facing the optoelectronic semiconductor component part, is explained in conjunction with FIGS. 6A and 6B. In this case, the frame 33 delimits the tolerance range 4 on the upper side 2a of the connection carrier 2 in the lateral direction. After the mechanical and electrical connection of the semiconductor component part 1 and the connection carrier 2, the frame 33 and therefore one component of the positioning apparatus 3 can be removed. The frame 33 may be, for example, a type of soldering template which can be reused after removal from the connection carrier 2. The frame 33 in this case comprises a spring element on its inner faces facing the side faces 1c of the semiconductor component part 1, via which spring element the tolerance range 4 is determined. The spring element enables a certain degree of play during fitting of the semiconductor component part 1.

A further exemplary embodiment of a method described herein will be explained in more detail in conjunction with FIGS. 7A to 7E. In contrast to the method described in conjunction with FIGS. 5A to 5F, the fitting of the optical element 7 relative to the connection carrier 2, the heat sink 5 and the optoelectronic component part 1 is performed by means of a fastening means 6, which is provided in the form of pins which protrude from the heat sink 5 through the connection carrier 2 into corresponding cutouts in the optical element 7.

The description on the basis of the exemplary embodiments does not in any way restrict the invention to these exemplary embodiments. Rather, the invention includes any novel feature and any combination of features, which includes in particular any combination of features in the patent claims, even if this feature or this combination itself is not explicitly cited in the patent claims or exemplary embodiments.

This application claims the priority of the German patent application 102012106982.4, the disclosure content of which is incorporated hereby by reference.

The invention claimed is:

1. A method for producing a light-emitting means, comprising the following steps:
   providing an optoelectronic semiconductor component part comprising a housing body, at least one light-emitting diode chip, which is arranged in the housing body, and at least two electrical connection points, which are arranged on a lower side of the optoelectronic semiconductor component part;
   providing a connection carrier comprising at least two contact points, which are arranged on an upper side of the connection carrier;
   providing a positioning apparatus, which is in direct contact with the connection carrier and/or the optoelectronic semiconductor component part;
   providing a connecting means between the connection points of the optoelectronic semiconductor component part and the contact points of the connection carrier; and
   mechanically fastening and electrically connecting the optoelectronic semiconductor component part on the connection carrier by means of the connecting means,
   wherein the positioning apparatus keeps the optoelectronic semiconductor component part within a tolerance range on the upper side of the connection carrier during the mechanical fastening and electrical connection, and
   wherein at least one component of the positioning apparatus is removed once the optoelectronic semiconductor component part has been mechanically fastened and electrically connected on the connection carrier.

2. The method according to claim 1, wherein the tolerance range is completely in a plane which runs parallel to the main plane of extent of the lower side, facing the connection carrier, of the optoelectronic semiconductor component part.

3. The method according to claim 1, wherein the tolerance range has an area which is greater than the maximum cross-sectional area of the optoelectronic semiconductor component part on the lower side, facing the connection carrier, of the optoelectronic semiconductor component part in a plane parallel to the plane in which the tolerance range lies.

4. The method according to claim 1, wherein the positioning apparatus comprises at least two components, which are formed and/or fastened on the connection carrier and/or on the optoelectronic semiconductor component part.

5. The method according to claim 1, wherein the positioning apparatus comprises at least three pins, which are in direct contact with the connection carrier and are mechanically stable connected to the connection carrier,
   wherein the pins protrude beyond the connection carrier on its upper side facing the optoelectronic semiconductor component part,
   wherein the pins delimit the tolerance range in lateral directions, and
   wherein the optoelectronic semiconductor component part, after the mechanical fastening and electrical connection, is in direct contact with at most two of the pins.

6. The method according to claim 1, wherein the positioning apparatus comprises at least two pins and at least two cutouts,
   wherein one cutout is uniquely assigned to each pin,
   wherein one of the pins is in direct contact with the optoelectronic semiconductor component part and is mechanically stable connected to the optoelectronic semiconductor component part, and the assigned cutout is arranged in the connection carrier, or one of the pins is in direct contact with the connection carrier and is mechanically stable connected to the connection carrier, and the associated cutout is arranged in the optoelectronic semiconductor component part, and
   wherein at least for one pair comprising pin and assigned cutout, the cutout has, at least at points, a greater diameter than the pin.

7. The method according to claim 1, wherein the positioning apparatus comprises a frame, which protrudes beyond the connection carrier on its upper side facing the optoelectronic semiconductor component part,
   wherein the frame comprises a spring element, which is in contact with the optoelectronic semiconductor component part, and
   wherein the frame delimits the tolerance range in lateral directions.

8. The method according to claim 1, wherein the at least one component of the positioning apparatus is mechanically stable connected to the connection carrier or the optoelectronic semiconductor component part prior to the removal, and
   wherein the connection carrier or the optoelectronic semiconductor component part has separation traces after the removal which originate from the removal of the at least one component of the positioning apparatus.

9. The method according to claim 1, wherein owing to the removal of the at least one component of the positioning apparatus, at least one cutout in the optoelectronic semiconductor component part or in the connection carrier is exposed, and
   wherein the at least one exposed cutout is used for adjusting and/or mechanically fastening an optical element.

10. The method according to claim 1, further comprising the following steps:
    providing a heat sink; and
    mechanically fastening the connection carrier to the heat sink on the lower side, facing the optoelectronic semiconductor component part, of the connection carrier.

11. The method according to claim 10, wherein the mechanical fastening of the connection carrier on the heat sink is performed at least partially by means of at least one component of the positioning apparatus.

12. The method according to claim 11, wherein a pin of the positioning apparatus is brought into direct contact with the heat sink.

13. The method according to claim 10, wherein the optoelectronic semiconductor component part and/or the connection carrier and/or the heat sink comprises, in addition to the components of the positioning apparatus, at least one fastening means, which is adjusted with respect to the positioning apparatus, and wherein an optical element is fastened mechanically relative to the semiconductor component part and/or relative to the connection carrier and/or relative to the heat sink by means of the fastening means.

14. A method for producing a light-emitting means, comprising the following steps:

providing an optoelectronic semiconductor component part comprising a housing body, at least one light-emitting diode chip, which is arranged in the housing body, and at least two electrical connection points, which are arranged on a lower side of the optoelectronic semiconductor component part;

providing a connection carrier comprising at least two contact points, which are arranged on an upper side of the connection carrier;

providing a positioning apparatus, which is in direct contact with the connection carrier and/or the optoelectronic semiconductor component part;

providing a connecting means between the connection points of the optoelectronic semiconductor component part and the contact points of the connection carrier; and mechanically fastening and electrically connecting the optoelectronic semiconductor component part on the connection carrier by means of the connecting means, wherein the positioning apparatus keeps the optoelectronic semiconductor component part within a tolerance range on the upper side of the connection carrier during the mechanical fastening and electrical connection, and wherein during the mechanical fastening and electrical connection the optoelectronic semiconductor component part floats on the connecting means in such a way that it abuts the positioning apparatus.

15. A method for producing a light-emitting means, comprising the following steps:

providing an optoelectronic semiconductor component part comprising a housing body, at least one light-emitting diode chip, which is arranged in the housing body, and at least two electrical connection points, which are arranged on a lower side of the optoelectronic semiconductor component part;

providing a connection carrier comprising at least two contact points, which are arranged on an upper side of the connection carrier;

providing a positioning apparatus, which is in direct contact with the connection carrier and/or the optoelectronic semiconductor component part;

providing a connecting means between the connection points of the optoelectronic semiconductor component part and the contact points of the connection carrier; and mechanically fastening and electrically connecting the optoelectronic semiconductor component part on the connection carrier by means of the connecting means, wherein the positioning apparatus keeps the optoelectronic semiconductor component part within a tolerance range on the upper side of the connection carrier during the mechanical fastening and electrical connection, wherein the positioning apparatus comprises at least two pins and at least two cutouts, wherein at least one of the pins is an oval pin, and wherein during positioning of the oval pin in the corresponding cutout a play results, which causes the tolerance range during connection of the optoelectronic semiconductor component part and the connection carrier.

* * * * *